US00RE37361B1

(19) United States
(12) Reissued Patent
Yanagihara et al.

(10) Patent Number: US RE37,361 E
(45) Date of Reissued Patent: Sep. 11, 2001

(54) SCANNING TYPE EXPOSURE APPARATUS AND EXPOSURE METHOD

(75) Inventors: Masamitsu Yanagihara, Yokohama; Susumu Mori; Tsuyoshi Naraki, both of Tokyo; Masami Seki, Shiki; Seiji Miyazaki, Yokohama; Tsuyohsi Narabe, Ohmiya; Hiroshi Chiba, Yokohama, all of (JP)

(73) Assignee: Nikon Corporation, Tokyo (JP)

(21) Appl. No.: 09/300,376

(22) Filed: Apr. 27, 1999

Related U.S. Patent Documents

Reissue of:
(64) Patent No.: 5,625,436
Issued: Apr. 29, 1997
Appl. No.: 08/689,691
Filed: Aug. 13, 1996

U.S. Applications:
(63) Continuation of application No. 08/337,467, filed on Nov. 8, 1994, now abandoned.

(30) Foreign Application Priority Data

Nov. 11, 1993 (JP) ..... 5-282308
Sep. 28, 1994 (JP) ..... 6-232963

(51) Int. Cl.[7] ..... H01L 21/027
(52) U.S. Cl. ..... 355/53; 355/50; 355/55; 355/77
(58) Field of Search ..... 355/50, 51, 53, 355/55, 56, 70, 77, 46

(56) References Cited

U.S. PATENT DOCUMENTS

| | | | |
|---|---|---|---|
| Re. 33,836 | 3/1992 | Resor, III et al. | 355/43 |
| 5,103,257 | 4/1992 | Wijnaendts-Van-Resandt | 355/53 |
| 5,172,189 | 12/1992 | Mitome | 356/401 |
| 5,184,196 | 2/1993 | Nakagawa et al. | 356/401 |

FOREIGN PATENT DOCUMENTS 63-128713 6/1988 (JP) .

* cited by examiner (List continued on next page.)

*Primary Examiner*—Joan Pendegrass
(74) *Attorney, Agent, or Firm*—Oliff & Berridge PLC

(57) ABSTRACT

[In a scanning type exposure apparatus for exposing an entire surface of a pattern region on a mask to a substrate by scanning the mask and the substrate with respect to a projection optical system in a predetermined direction with a speed ratio in accordance with a magnification of the projection optical system, there are provided a plurality of illumination optical systems for illuminating respective areas of the pattern region on the mask with respective light fluxes from respective light source; a plurality of projection optical systems arranged so as to correspond to the respective illumination optical systems, the projection optical systems projecting respective images of the areas illuminated by the respective illumination optical systems onto respective projection areas on the substrate; a memory device for obtaining and storing a change of shape of the substrate; a magnification changing device for changing a magnification of at least one of the projection optical systems in accordance with the change of shape of the substrate; and an imaging position changing device for changing the position of said image projected via the at least one projection optical systems in accordance with the change in magnification.] *An exposure apparatus for exposing a pattern of a mask onto a substrate includes an image transfer system, an imaging characteristic adjusting mechanism and an exposure system. The image transfer system projects the pattern of the mask onto the substrate while moving the mask and the substrate synchronously during the projection of the pattern onto the substrate such that portions of the pattern overlap each other. The imaging characteristic adjusting mechanism is disposed in a space between the mask and the substrate, and adjusts imaging characteristics of a portion of the image transfer system that projects the pattern onto the substrate. The exposure system exposes the pattern during the synchronous movement of the mask and the substrate by the image transfer system.*

61 Claims, 10 Drawing Sheets

U.S. PATENT DOCUMENTS

| | | | |
|---|---|---|---|
| 5,194,893 | 3/1993 | Nishi | 355/53 |
| 5,227,838 | 7/1993 | Nakanishi et al. | 355/53 |
| 5,227,839 | 7/1993 | Allen | 355/53 |
| 5,286,963 | 2/1994 | Torigoe | 250/201.2 |
| 5,291,240 | 3/1994 | Jain | 355/53 |
| 5,298,939 | 3/1994 | Swanson et al. | 355/53 |
| 5,309,197 | 5/1994 | Mori et al. | 355/53 |
| 5,343,270 | 8/1994 | Sakakibara et al. | 355/53 |
| 5,361,122 | 11/1994 | Kataoka et al. | 355/53 |
| 5,416,562 | 5/1995 | Ota et al. | 355/53 |
| 5,440,397 | 8/1995 | Ono et al. | 356/401 |
| 5,506,684 | 4/1996 | Ota et al. | 356/401 |
| 5,528,027 | 6/1996 | Mizutani | 250/234 |
| 5,530,516 | 6/1996 | Sheets | 355/53 |
| 5,559,629 | 9/1996 | Sheets et al. | 359/364 |
| 5,729,331 * | 3/1998 | Tanaka et al. | 355/53 |

TRA ERR

OVER LAP : $\eta = M \times L - L = (M-1) \times L$

SFT : $\kappa = M \times B - B = (M-1) \times B$ $$\Delta \ell = (1 - 1/n)\, t\theta$$

SCANNING TYPE EXPOSURE APPARATUS AND EXPOSURE METHOD

Matter enclosed in heavy brackets [ ] appears in the original patent but forms no part of this reissue specification; matter printed in italics indicates the additions made by reissue.

This is a continuation of application Ser. No. 08/337,467, filed Nov. 8, 1994, now abandoned.

BACKGROUND OF THE INVENTION

1. Field of the Invention

The present invention relates to a scanning type exposure apparatus and more particularly to a scanning type exposure apparatus capable of performing preferable exposure to a substrate expanded and contracted due to a previous exposure process.

2. Related Background Art

Recently, as display devices such as of personal computers, televisions, etc., liquid crystal display devices have been used widely. In such a liquid crystal display device, transparent thin film electrodes are formed on a glass plate in the photolithography in accordance with a predetermined pattern. For the photolithography, projection exposure apparatuses are used in which an original pattern formed on a mask is exposed on a photoresist layer on a glass substrate. There are various step-and-repeat type or mirror projection type exposure apparatuses.

Generally, in such projection exposure apparatuses, an original pattern is exposed on a glass substrate repeatedly one over another for many layers. As a result, the glass substrate is expanded and contracted due to those exposure processes (heat) thereby to be deformed from the initial state. In the conventional step-and-repeat type exposure apparatuses, only one projection optical system is provided, and the expansion and contraction of a glass plate are corrected (magnification correction) by changing the magnification of the projection optical system and changing the stopped position of a substrate stage at the time of each stepping operation thereby to change distances between adjacent transferred images. Also, in the mirror projection type exposure apparatuses, the magnification in the scanning direction is corrected by sequentially changing the relative position of an original plate and a photosensitive substrate with respect to a projection optical system during scanning exposure while the magnification in the direction perpendicular to the scanning direction is corrected by changing the magnification of the projection optical system.

SUMMARY OF THE INVENTION

Recently, it is needed to form liquid crystal display substrates large in size and accordingly, it is desired to enlarge an exposure region in a projection exposure apparatus. For the enlargement of the exposure region, it is considered to use an apparatus for performing scanning exposure by the use of a plurality of projection optical systems, instead of using conventional step-and-repeat exposure apparatuses and mirror projection scanning type exposure apparatuses. For example, a plurality of illumination optical systems are provided, and respective light fluxes emitted from the illumination optical systems illuminate different areas on a mask and project images of the respective different areas onto respective projection areas on a glass substrate via the respective projection optical systems. More specifically, a light flux emitted from a light source is made uniform in its light quantity via an optical system including a fly eye lens and the like, shaped by a field stop into a desired shape, and thereafter illuminate the pattern surface of the mask. A plurality of such illumination optical systems are provided and light fluxes emitted from the respective illumination optical systems illuminate different small areas (illumination areas) on the mask. The light fluxes transmitted through the mask form pattern images of the mask on respective different projection areas on the glass substrate via the respective projection optical systems. Then, by scanning the mask and glass substrate synchronously with respect to the projection optical systems, the entire surface of the pattern region on the mask is transferred to the glass substrate.

Thus, when the scanning type exposure apparatus is provided with the plurality of projection optical systems, the expansion and contraction of the substrate cannot be corrected by the above-mentioned conventional method.

Therefore, it is an object of the present invention to provide a scanning type exposure apparatus capable of correcting the expansion and contraction of a substrate preferably even though the apparatus is equipped with a plurality of projection optical systems.

For achieving the above object, according to the present invention, in a scanning type exposure apparatus having a plurality of illumination optical systems for shaping light fluxes from respective light source into a predetermined shape with respective field stops and illuminating respective areas of a pattern region on a mask with the respective light fluxes passed through the field stops and a plurality of projection optical systems disposed so as to correspond to the respective illumination optical systems, wherein respective images of the areas of the pattern region illuminated by the illumination optical systems are projected via the respective projection optical systems onto projection areas on a substrate and the entire surface of the pattern region is exposed by shifting the mask and the substrate in a predetermined direction (X-direction) at a speed ratio in accordance with the magnification of the projection optical systems, there are provided memory means for obtaining and storing a change of shape of the substrate; magnification changing means for changing the magnification of at least one of the plurality of projection optical systems in accordance with the change of shape; and imaging position changing means for changing the position of the image of the area projected by at least one projection optical system.

Also, in accordance with, among the change of shape, a change in a perpendicular direction (Y-direction) to the predetermined direction, the magnification of the at least one projection optical system, and the position of the image projected via the at least one projection optical system in the perpendicular direction are changed, and in accordance with, among the change of shape, a change in the shifting direction (X-direction), the position of the image of said at least one projection optical system in said scanning direction is changed.

Further, the exposure apparatus is provided with speed ratio changing means for changing the speed ratio of the mask to the substrate in accordance with the change of shape of the substrate.

The plurality of projection optical systems are arranged such that adjacent projection optical systems in a perpendicular direction (Y-direction) to the predetermined direction (X-direction) are displaced from each other in the predetermined direction to form a plurality of rows in the perpendicular direction.

The imaging position changing means are a plurality of plane parallel glasses with the same thickness disposed in respective optical axes of the projection optical systems and the plane parallel glasses are displaced at respectively different angles with respect to the respective optical axes in accordance with the change of shape of the substrate.

The imaging position changing means may be a plurality of plane parallel glasses with different thickness disposed in respective optical axes of the projection optical systems and the plane parallel glasses are displaced at the same angle with respect to the respective optical axes in accordance with the change of shape of the substrate.

Also, the above substrate has a plurality of alignment marks arranged in the vicinity of the projection areas along the predetermined direction (X-direction) and the scanning type exposure apparatus further are provided with mark detecting means disposed with a predetermined positional relationship with respect to the projection optical systems in a position capable of detecting at least a portion of the alignment marks so as to detect the alignment marks while the mask and the substrate are moved; and positioning means for correcting the position of the mask or the substrate with respect to the projection optical systems in accordance with the detection result of the mark detecting means.

Also, the change of shape of the substrate is obtained in accordance with positions of the alignment marks detected by the mark detecting means.

In a method of illuminating a plurality of areas on a pattern region on a mask with respective light fluxes from a plurality of illumination optical systems, projecting respective images of the illuminated areas on projection areas on a substrate via a plurality of projection optical systems, and exposing the entire surface of the mask on the substrate by shifting the mask and the substrate with respect to the projection optical systems in a predetermined direction (X-direction) with a speed ratio in accordance with the magnification of the projection optical systems, a change of shape of the substrate is obtained in advance, the magnification of at least one of the projection optical systems is changed in accordance with the change of shape, and the position of the image projected by the at least one projection optical system is changed.

In this exposure method, the magnification of the at least one projection optical system, and the position of the image projected via the at least one projection optical system in the perpendicular direction are changed in accordance with, among the change of shape, a change in a perpendicular direction (Y-direction) to the predetermined direction (X-direction), and the position of the image projected via the at least one projection optical system in the predetermined direction is changed in accordance with, among the change of shape, a change in the predetermined direction.

Further, in the exposure method, the speed ratio is changed in accordance with the change of shape of the substrate.

According to the present invention, the magnification of the at least one projection optical system is changed in accordance with the change of shape of the substrate, and the position of the image projected via the at least one projection optical system is changed, it is possible to transfer the mask pattern to the substrate with possible to transfer the mask pattern to the substrate with its image corrected preferably with respect to the change of shape of the substrate.

Also, the magnification of the at least one projection optical system, and the position of the image projected via the at least one projection optical system in the perpendicular direction are changed in accordance with, among the change of shape, a change in the perpendicular direction to the predetermined direction, and the position of the image projected via the at least one projection optical system in the predetermined direction is changed in accordance with, among the change of shape, a change in the predetermined direction. Therefore, the correction in accordance with the change of shape of the substrate is possible.

Further, as the apparatus is provided with the speed ratio changing means for changing the speed ratio of the mask to the substrate in accordance with the change of shape of the substrate, easy correction with respect to the change of shape of the substrate in the predetermined direction is possible.

Since the plurality of projection optical systems are arranged such that adjacent projection optical systems along a perpendicular direction to the predetermined direction are displaced from each other in the predetermined direction to form a plurality of rows in the perpendicular direction, the correction of the change of shape of the substrate according to the above structure becomes effective.

Also, when the imaging position changing means are a plurality of plane parallel glasses with the same thickness disposed in respective optical axes of the projection optical systems and the plane parallel glasses are displaced at respectively different angles with respect to the respective optical axes in accordance with the change of shape of the substrate, the change of the position of the image becomes easy.

On the other hand, when the imaging position changing means are a plurality of plane parallel glasses with different thicknesses disposed in respective optical axes of the projection optical systems and the plane parallel glasses are displaced at the same angle with respect to the respective optical axes in accordance with the change of shape of the substrate, the change of the position of the image becomes easy, too.

Further, the above substrate has the plurality of alignment marks arranged in the vicinity of the projection areas along the predetermined direction and the scanning type exposure apparatus are provided with the mark detecting means disposed with the predetermined positional relationship with respect to the projection optical systems in the position capable of detecting at least a portion of the alignment marks so as to detect the alignment marks while the mask and the substrate are moved; and the positioning means for correcting the position of the mask or the substrate with respect to the projection optical systems in accordance with the detection result of the mark detecting means. Therefore, it is possible to obtain the change of shape of the substrate by the exposure apparatus.

Further, since the change of shape of the substrate is obtained in accordance with positions of the alignment marks detected by the mark detecting means, the change of shape of the substrate can be obtained easily.

In the method of illuminating the plurality of areas on the pattern region on the mask with respective light fluxes from the plurality of illumination optical systems, projecting respective images on the illuminated areas on the projection areas on the substrate via the plurality of projection optical systems, and exposing the entire surface of the mask on the substrate by shifting the mask and the substrate with respect to the projection optical systems in the predetermined direction with the speed ratio in accordance with the magnification of the projection optical systems, the change of shape of the substrate is obtained in advance, the magnification of at least one of the projection optical systems is changed in accordance with the change of shape, and the position of the image projected via the at least one projection optical system is changed. Therefore, it is possible to transfer the mask pattern to the substrate with its image corrected preferably with respect to the change of shape of the substrate.

Also, in this exposure method, the magnification of the at least one projection optical system, and the position of the image projected via the at least one projection optical system in the perpendicular direction are changed in accordance with, among the change of shape, a change in a perpendicular direction to the predetermined direction, and the position of the image projected via the at least one projection optical system in the predetermined direction is changed in accordance with, among the change of shape, a change in the predetermined direction. Therefore, the correction with respect to the change of shape of the substrate is possible.

Furthermore, in the exposure method, as the speed ratio is changed in accordance with the change of shape of the substrate, the correction with respect to the change of shape of the substrate in the predetermined direction is easy.

According to the present invention, as above, the magnification of at least one of the projection optical system is changed in accordance with the amount of expansion and contraction of the substrate, and the position of the projected image is changed in accordance with the change of magnification, so that it is possible to correct the projected image of the mask pattern in accordance with the expansion and contraction of the substrate. Therefore, even though the image of the mask pattern is exposed repeatedly on the substrate one over another for a plurality of layers, the exposed images on the substrate will not be deviated from each other.

DESCRIPTION OF THE PREFERRED EMBODIMENTS

Figure 1:
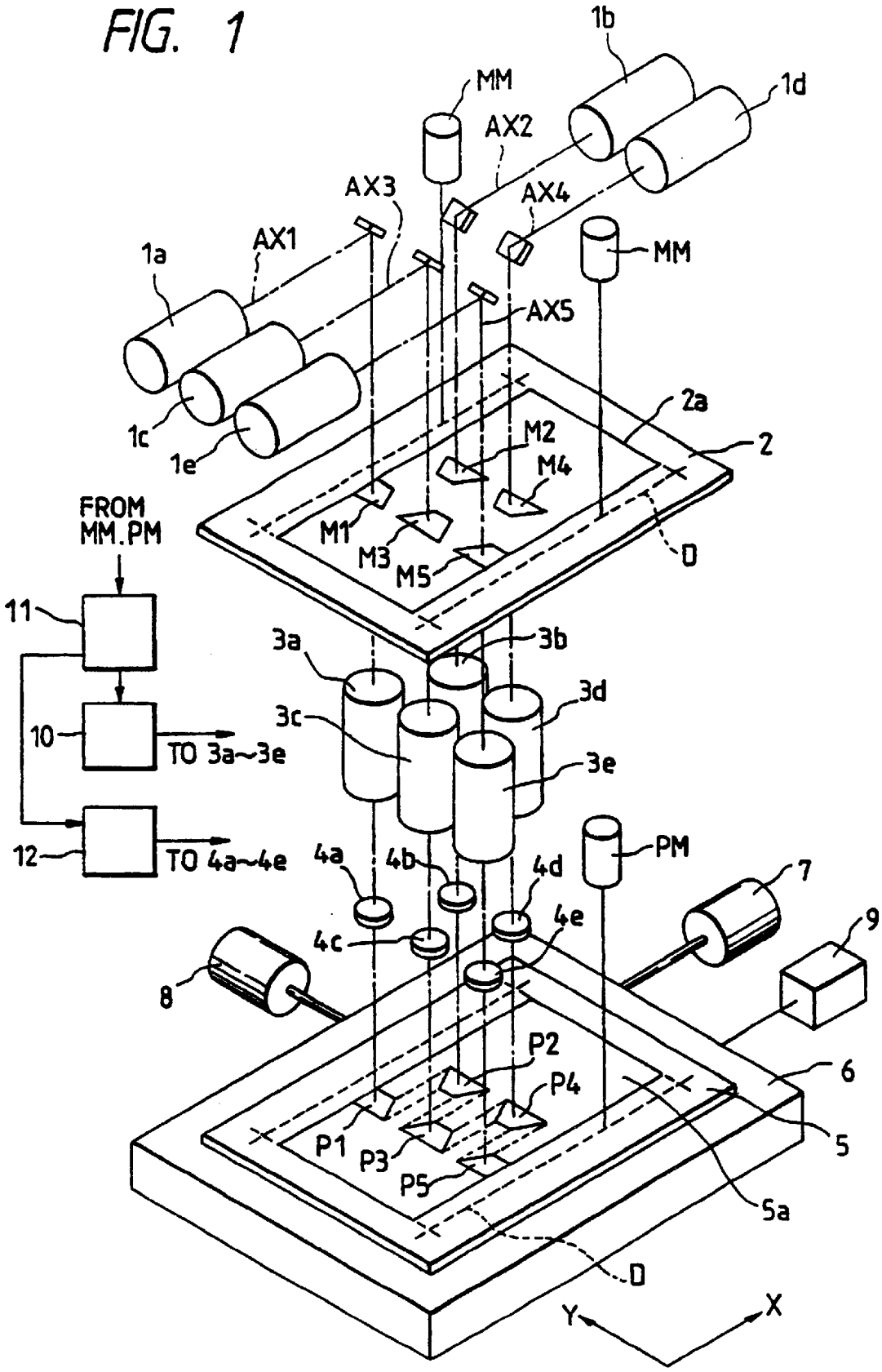
FIG. 1 is a schematic diagram showing the structure of a scanning type exposure apparatus according to an embodiment of the present invention.
Figure 2:
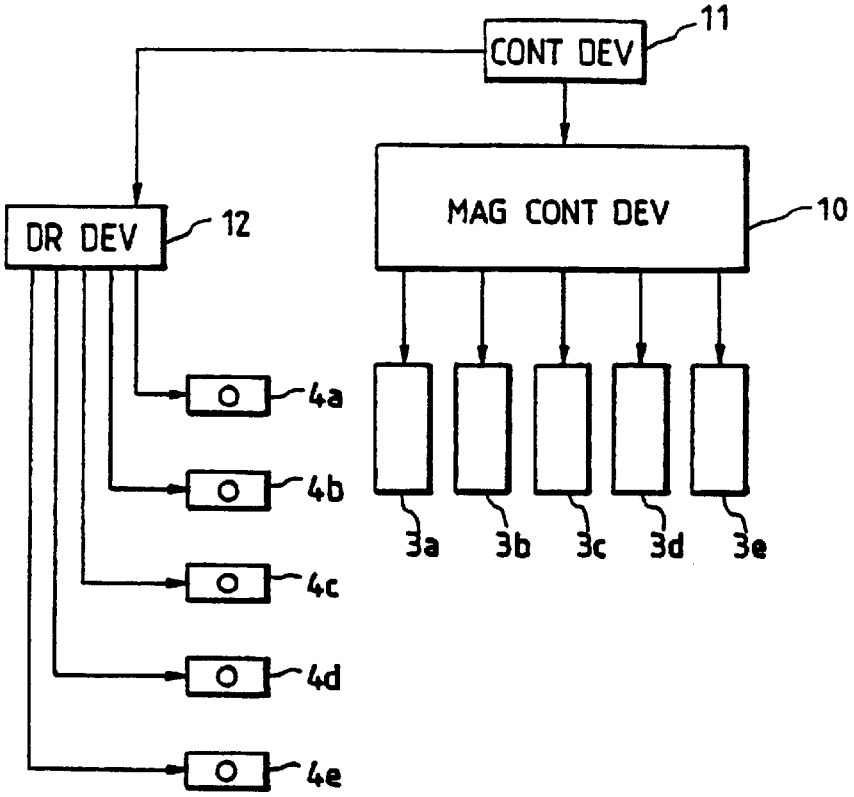
FIG. 2 is a block diagram showing the structure of the control system for shifting optical axes of the projection optical systems in the apparatus of FIG. 1.
Figure 3:
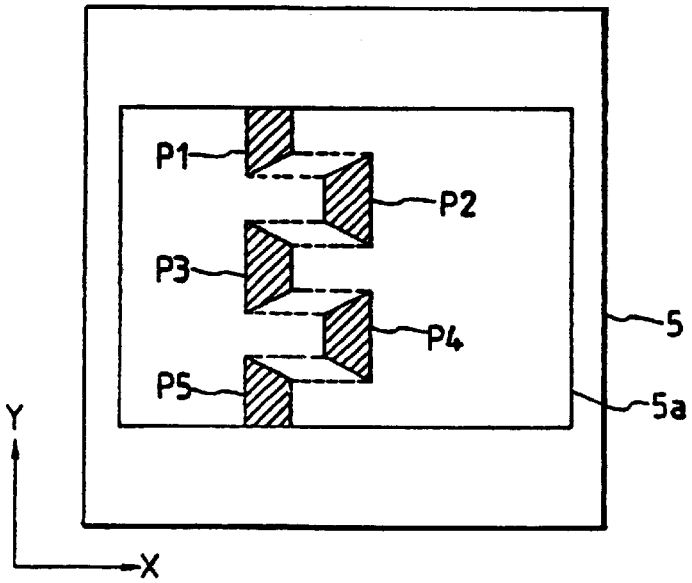
FIG. 3 shows the state of the projection areas projected on the photosensitive substrate.

FIG. 1 schematically shows the structure of a scanning type exposure apparatus according to an embodiment of the present invention. FIG. 2 is a block diagram showing the structure of a control system for shifting imaging positions of projected images via projection optical systems of the exposure apparatus in FIG. 1. A light flux emitted from a light source such as an extra-high pressure mercury lamp is shaped into a predetermined shape by an illumination optical system 1a including a fly eye lens, an illumination field stop and the like and forms the image of the field stop on a pattern surface of a mask 2. In this apparatus, a plurality of illumination optical systems the same as the illumination optical system 1a are provided, and respective light fluxes emitted from the illumination optical system 1a to 1e illuminate small areas (illumination areas) M1 to M5 on the mask 2. The plurality of light fluxes transmitted through the mask 2 form pattern images of the illumination areas M1 to M5 of the mask 2 on respective projection areas P1 to P5 on a photosensitive substrate 5 via the projection optical systems 3a to 3e. In this case, the projection optical systems 3a to 3e are one-to-one erecting systems. The respective projection optical systems 3a to 3e are provided with magnification control devices 10 for changing magnifications of the projection optical systems by adjusting the air pressure between optical elements of each projection optical system. Further, plane parallel glasses 4a to 4e are disposed in respective light paths between the projection optical systems 3a to 3e and the photosensitive substrate 5. The projection positions (projection areas P1 to P5) of the pattern images on the photosensitive substrate 5 are changed by changing angles of the respective plane parallel glasses 4a to 4e with respect to optical axes AX1 to AX5 to shift the optical axes of the projection optical axes. The projection areas P1 to P5 on the photosensitive substrate 5 are in a trapezoid shape. As shown in FIG. 3, adjacent projection areas (e.g., P1 and P2, P2 and P3) along in a Y-direction (nonscanning direction) are displaced in an X-direction (scanning direction) by a predetermined amount from each other, and end portions of adjacent projection areas (ranges indicated by broken lines) are overlapped in the Y-direction (i.e., two lows along the Y-direction). Accordingly, the plurality of projection optical systems 3a to 3e are displaced by a predetermined amount in the X-direction and overlapped in the Y-direction in accordance with the arrangement of the projection areas P1 to P5. The plurality of the illumination optical systems 1a to 1e are arranged such that the arrangement of the illumination areas on the mask 2 becomes the same as that of the projection areas P1 to P5. The whole surface of a pattern region 2a on the mask 2 is transferred onto an exposure region 5a on the photosensitive substrate 5 by scanning the mask 2 and the photosensitive substrate 5 synchronously in the X-direction with respect to the projection optical systems 3a to 3e.

The photosensitive substrate 5 is disposed on a substrate stage 6. The substrate stage 6 is provided with a drive device 7 having a long stroke in the scanning direction for performing one-dimensional scanning exposure, and a drive device 8 having a short stroke for moving the stage 6 slightly in the Y-direction. Further, the substrate stage 6 is provided with a position measuring device (e.g., laser interferometer)

9 for detecting the position of the substrate stage in the scanning direction with high resolving power and high precision.

The mask 2 is supported by a mask stage (not shown). Similarly, the mask stage is provided with a drive device having a long stroke in the scanning direction, a drive device having a short stroke in the direction perpendicular to the scanning direction, and a position measuring device for detecting the position of the mask stage in the scanning direction. Further, at least one of the substrate stage and the mask stage has a rotating mechanism for correcting the rotation of the mask or the photosensitive substrate.

Figure 10:
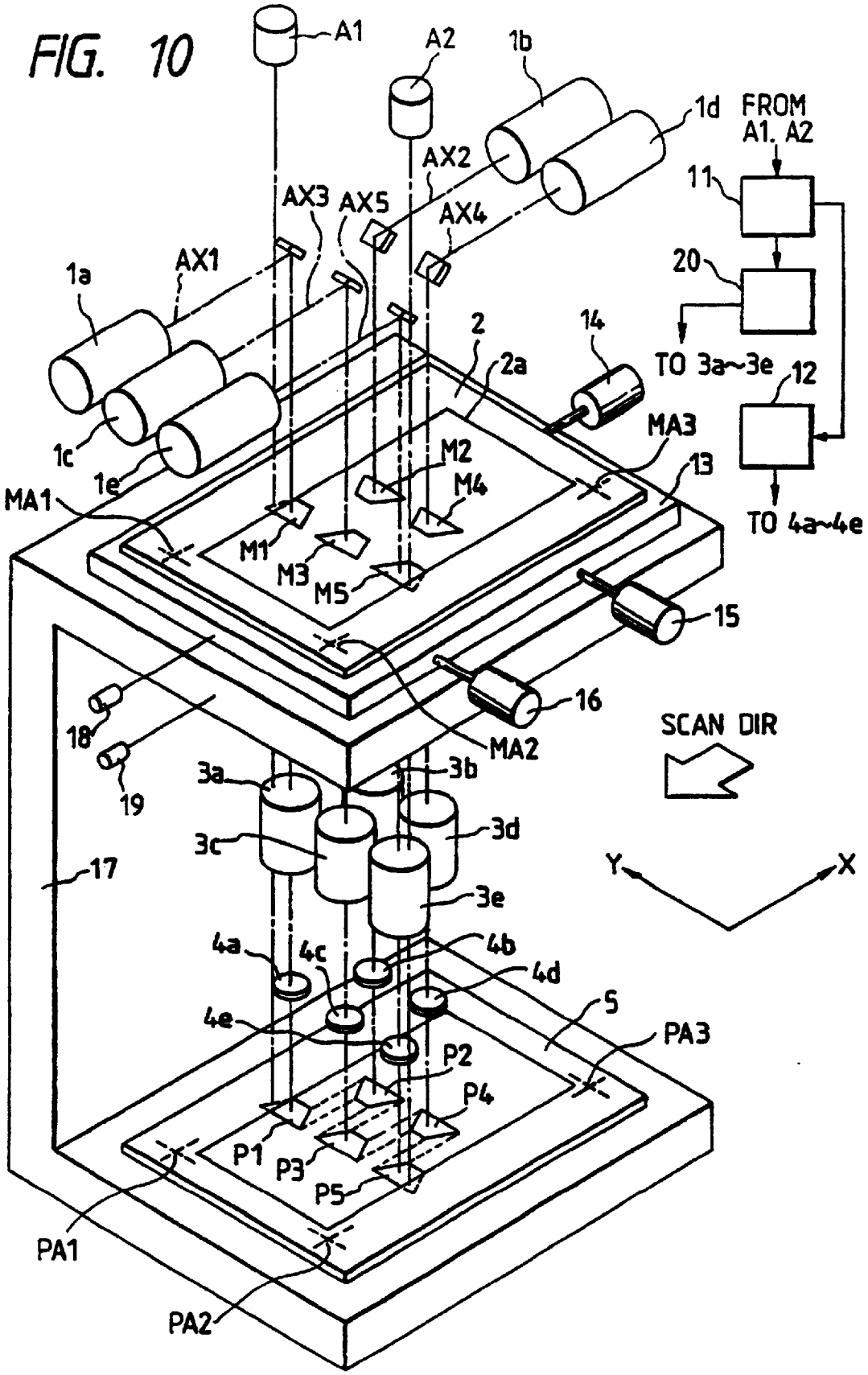
FIG. 10 shows a modification of the scanning type exposure apparatus of the present invention.

The mask 2 and the photosensitive substrate 5 (or the mask stage and the substrate stage 6) may be supported together by a carriage as shown in FIG. 10.

Figure 4A:
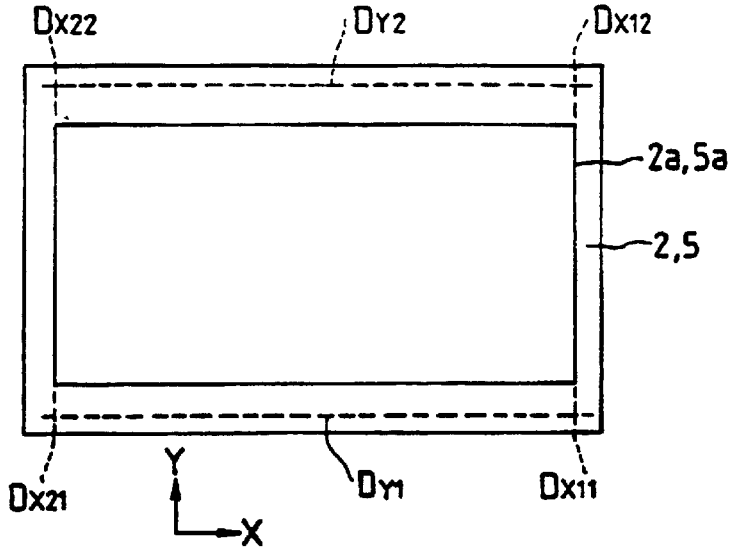
FIG. 4A shows the alignment marks formed on the photosensitive substrate.

Alignment marks D are formed on the respective photosensitive substrate 5 and the mask 2. Alignment sensors PM, MM are provided in predetermined positions with respect to the exposure apparatus so as to detect those alignment marks D. It is necessary to provide at least two alignment sensors PM and at least two alignment sensors MM, and the positions of the marks are detected by signal processing devices (not shown). As shown in FIG. 4, the alignment mark D is constituted by marks $Dy_1$, $Dy_2$ (represented by the marks Dy) formed in the vicinity of the transfer region 5a of the photosensitive substrate or the pattern region 2a of the mask 2 approximately successively along the scanning direction, and marks $Dx_{11}$, $Dx_{12}$, $Dx_{21}$, $Dx_{22}$ (represented by the mark Dx) formed at lateral ends of the marks $Dy_1$, $Dy_2$ so as to be spaced away for a predetermined distance from each other in the Y-direction. Also, the alignment marks D are a set of grating-like marks, as shown in FIG. 4C. Laser beams are emitted to the marks D and the positions of the marks D with respect to the sensors PM, MM are obtained by detecting diffracted light of each laser beam.

Figure 4B:
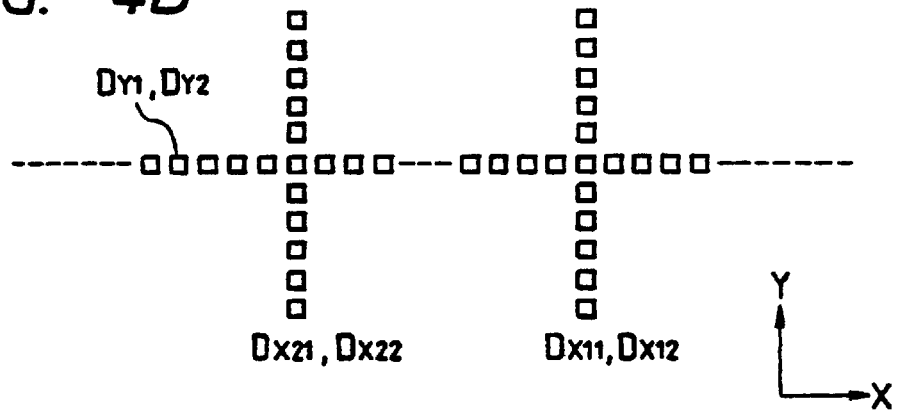
FIG. 4B shows the shapes of the alignment marks.
Figure 4C:
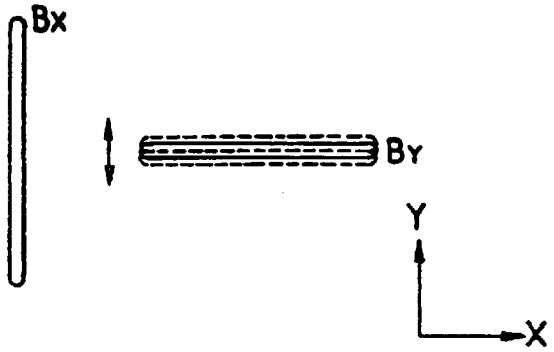
FIG. 4C shows the beams for detecting the alignment marks.

Laser beams emitted to the marks D are in the shape of a slit, as shown in FIG. 4B. A laser beam Bx detects the mark Dx while a laser beam By detects the mark Dy. The laser beam By is vibrated with a constant amplitude and a constant frequency as indicated by broken lines. The diffracted light produced from the mark D due to each beam Bx, By is detected via slits of the respective alignment sensors PM, MM by detectors and converted to electric signals.

Figure 5A:
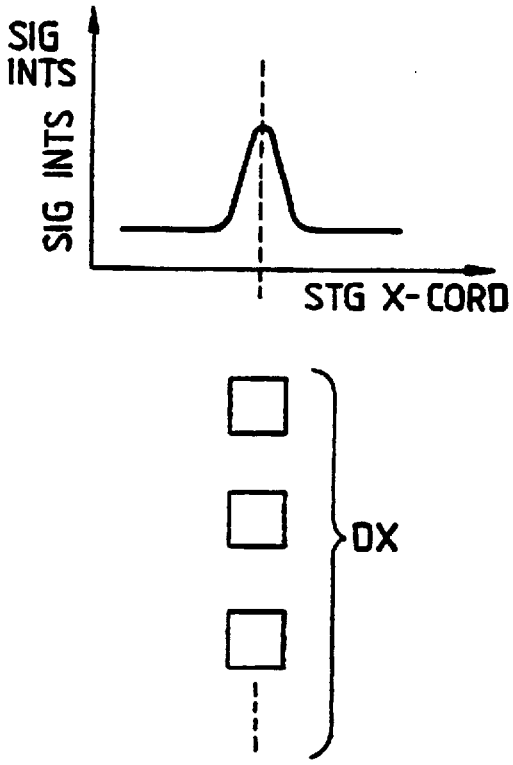
FIG. 5A is a graph of a waveform obtained by the alignment sensor.
Figure 5B:
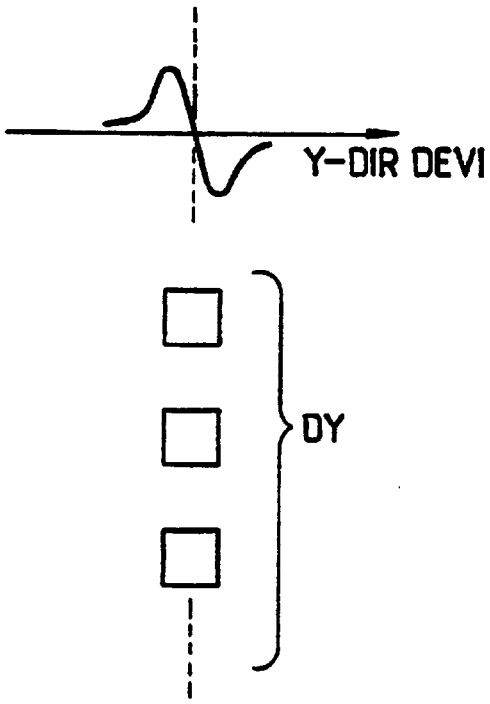
FIG. 5B is a graph of a waveform obtained by the alignment sensor.

The signal of the mark Dx due to the beam Bx becomes a waveform in FIG. 5A indicating the change in signal intensity in accordance with the X-coordinate detected by the position measuring device 9, and the center position of the mark Dx can be detected with the x-coordinate by performing a predetermined algorithm process. The signal of the mask Dy due to the beam By can be obtained as the change in signal intensity with respect to the deviation of the position in the Y-direction as shown in FIG. 5B by detecting, on the same frequency as the vibration, the phase of the signal intensity obtained by the vibration of the beam and changed with time. By subjecting the change in signal intensity to an AGC process before the phase detection, a constant intensity distribution is obtained in accordance with the deviation of the position in the Y-direction in spite of the magnitude of the intensity of the original signal.

The alignments of the photosensitive substrate 5 and the mask 2 are performed by the use of the above-structured alignment marks and the alignment sensors in accordance with the following procedure. The following description is directed to the alignment of the photosensitive substrate but the alignment of the mask is performed in the same manner.

1) The photosensitive substrate 5 is placed on the stage 6, and the stage 6 is moved such that the marks $Dx_{11}$, $Dx_{12}$ are positioned within respective detecting ranges of the two alignment sensors PM.

2) The positions of the marks $Dx_{11}$, $Dx_{12}$ in the X-direction are measured by scanning the marks and beams relatively.

3) The stage 6 is moved until the marks $Dx_{21}$, $Dx_{22}$ are positioned within detecting ranges of the alignment sensors PM. Then, the positions of the marks $Dx_{21}$, $Dx_{22}$ in the X-direction are detected.

As a result, the average value of the differences $(Dx_{11}-Dx_{21})$ and $(Dx_{12}-Dx_{22})$ of the respective positions becomes the amount of expansion and contraction of the photosensitive substrate in the X-direction. And, the average value of the differences $(Dx_{11}-Dx_{12})$ and $(Dx_{21}-Dx_{22})$ becomes the amount of rotation of the substrate around the optical axes.

4) The stage is rotated in accordance with the measured amount of rotation to correct the rotation of the substrate. For this, both the substrate stage and the mask stage may be rotated to correct the relative amount of rotation between the photosensitive substrate and the mask. In this case, there is no need to provide a rotating mechanism to one of the stages.

5) After the rotation correction, the positions of the marks are again measured to check the rotation and the position of the photosensitive substrate in the X-direction with respect to the mask is obtained.

6) While the marks Dy are detected by the alignment sensors, the stage 6 is moved in the X-direction. Regarding the mark Dy, a signal as shown in FIG. 5B is obtained. Therefore, the position of the stage 6 in the Y-direction is controlled by the drive device 8 such that the average value of the respective signals of the marks $Dy_1$, $Dy_2$ becomes zero.

The amount of expansion and contraction of the photosensitive substrate in the Y-direction due to its position in the X-direction can be obtained continuously by converting the difference between the detection signals of the mark $Dy_1$, $Dy_2$ to the distance in the Y-direction. The expansion and contraction of the photosensitive substrate in the X-direction can be corrected by changing the speed of moving the photosensitive substrate with respect to the design value based on the values obtained in the above processes 2) and 3). In this case, the marks Dx are formed only on both ends of the photosensitive substrate, so that it is impossible to correct the expansion and contraction in accordance with various positions in the X-direction. However, if the number of the measuring points is increased by forming marks Dx on three or more points and the amount of expansion and contraction of each position between the measuring points is measured, approximately continuous correction can be realized.

The amounts of expansion and contraction obtained as above are stored in the memory of a control device 11 in FIG. 2. Then, when performing exposure to the photosensitive substrate 5, the control device 11 changes magnifications of the projection optical systems 3a to 3e by means of the magnification control device 10 based on the amounts of expansion and contraction stored in the memory and sends instructions to a drive device 12 to drive the plane parallel glasses 4a to 4e to shift the optical axes. This operation is necessary for the reason that since the positional relationship between the overlapped portions of the projection area s as indicated by the broken lines in FIG. 3 is changed due to the changes of magnifications and the amount of exposure to the photosensitive substrate becomes uneven, the positional relationship between the projection areas is returned to the initial condition. The change in positional relationship between the plurality of projection areas when the magnifications of the projection optical systems are changed will be described with reference to FIGS. 7, 9A and 9B.

Figure 7:
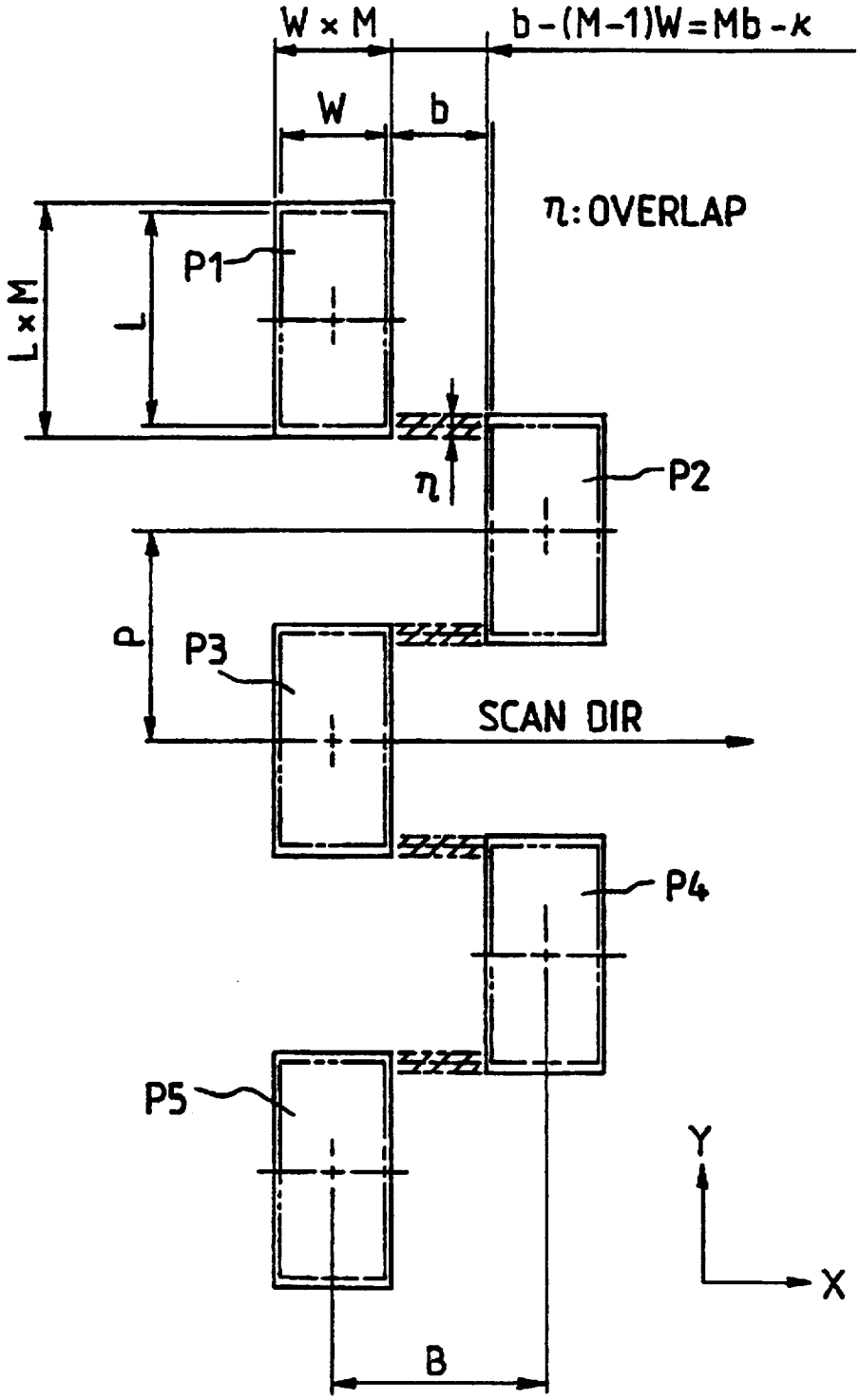
FIG. 7 is a diagram for explaining a change of the positional relationship of images produced in accordance with the change of magnification of the projection optical systems.

In FIG. 7, areas indicated by two-dot-chain lines represent the projection area P1 to P5 when the magnifications of the projection optical systems 3a to 3e is in the initial condition while areas indicated by solid lines represent projection areas when the magnifications of the projection optical systems are changed. For the simplicity of the description, the shape of the projection areas is made rectangular differently from that of the projection areas P1 to P5 in FIG. 1. At the time of the initial magnifications, the length of the projection areas in the Y-direction is L, the length thereof in the X-direction is W, the distance between the centers of the projection areas in the Y-direction (e.g., P1 to P2) is P, and the distance between the centers thereof in the X-direction is B. In this case, there is no unnecessary overlap $\eta$ in the Y-direction, and the positional relationship between the projection areas in the X-direction is set to be in a predetermined condition. Therefore, a lattice-like pattern as shown in FIG. 9A is transferred properly.

On the other hand, when each magnification of the projection optical systems is changed by the M times, the length of the projection areas in the Y-direction is L×M, and the length thereof in the X-direction is W×H. However, the distances between the centers of the projection areas are kept to be P and B. Accordingly, the positional relationship between the projection areas is changed (e.g., the distance between sides changes from "b" to "Mb−κ" or "b−(M−1) W") and the overlap $\eta$ and the deviation K expressed by the following expressions are produced respectively in the Y- and X-directions:

$$\eta = M \times L - L = (M-1) \times L \quad (1)$$

$$\kappa = M \times B - B = (M-1) \times B. \quad (2)$$

Figure 9B:
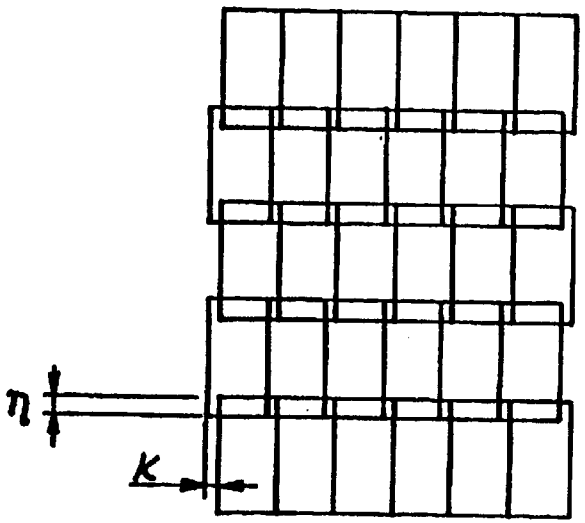
FIG. 9B shows deviations of images of the lattice-like pattern.
Figure 9A:
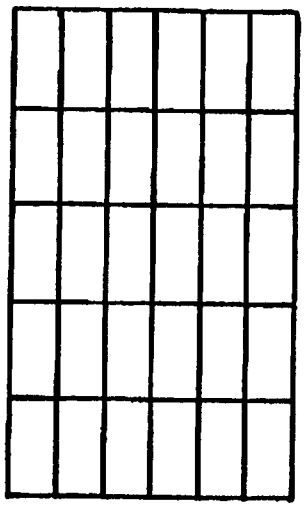
FIG. 9A shows a lattice-like pattern.

Therefore, the lattice-like pattern in FIG. 9A is transferred as an image including the overlaps $\eta$ and the deviations $\kappa$ as shown in FIG. 9B.

Then, in order to correct the overlaps and the deviations, the distances between the projection areas are changed in accordance with the change of magnification of the projection optical systems. Basically, this correction is carried out such that the dimensions of the projection areas and the distances between the projection areas are made similar before and after the correction. In connection with this correction, the correction of imaging positions of the projection areas will be described with reference to FIGS. 2, 6 and 12.

Figure 6:
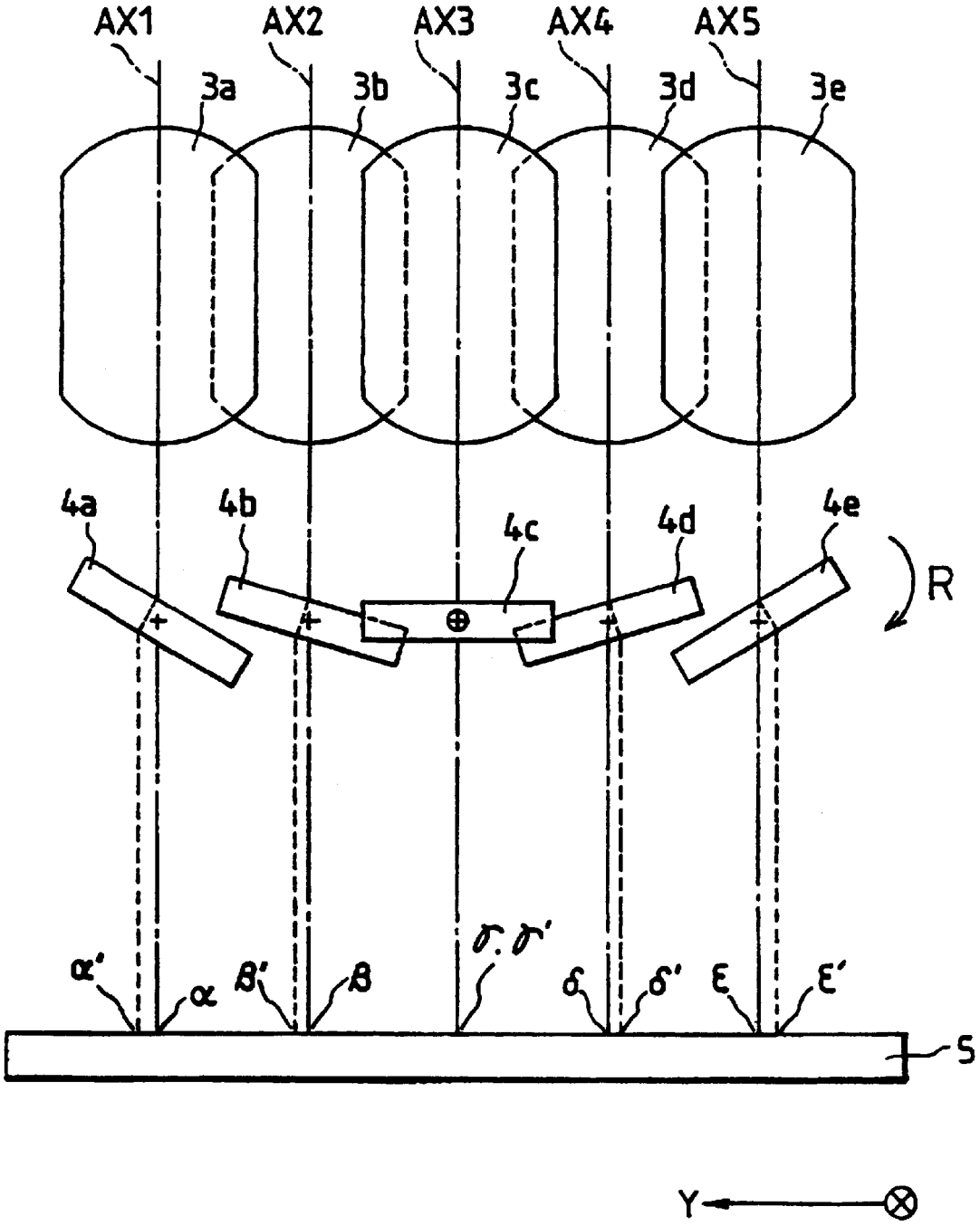
FIG. 6 is an explanatory diagram showing the state of correcting the optical axes in accordance with the expansion and contraction of the photosensitive substrate according to the embodiment of the present invention.

FIG. 6 shows the state of correcting the positions of the optical axes in accordance with the expansion and contraction of the photosensitive substrate according to this embodiment of the present invention. The same members and parts as those in FIG. 1 are designated by the same reference numerals. The thicknesses of the plane parallel glasses 4a to 4e are approximately identical and the amount of shift for each optical axes AX1 to AX5 at the same angle of rotation is the same. Also, when the angles of rotations of the plane parallel glasses are zero, the positions of the optical axes AX1 to AX5 projected on the photosensitive substrate 5 are $\alpha$, $\beta$, $\gamma$, $\delta$, $\epsilon$. These positions $\alpha$, $\beta$, $\gamma$, $\delta$, $\epsilon$ can be considered as the positions of the patterns formed prior to the expansion and contraction of the photosensitive substrate.

Now, for example, the photosensitive substrate 5 is considered to be extended uniformly in the Y-direction by $\Delta p$ (ppm). In this case, the magnifications of the projection optical systems are changed and the optical axes are shifted in accordance with the changes of magnifications as follows. As the photosensitive substrate is extended uniformly, the displacement of each position thereof is proportional to the distance from the center of the photosensitive substrate. Therefore, the amount of shift for each optical axis is proportional to the distance from the center of the photosensitive substrate. That is, if the distances between the positions $\alpha$, $\beta$, $\gamma$, $\delta$, $\epsilon$ are l, the displacement of each position $|\alpha'-\alpha|$, $|\beta'-\beta|$, $|\gamma'-\gamma|$, $|\delta-\delta'|$, $|\epsilon-\epsilon'|$ becomes $2\Delta 1$, $\Delta 1$, 0, $\Delta 1$, $21\Delta 1$ respectively. Also, $\Delta 1 = 1 \times \Delta p/10^6$.

When exposing a pattern again on the pattern formed on the extended photosensitive substrate 5, each magnification of the projection optical systems 3a to 3e is enlarged by $\Delta p$ (ppm). Thereby, the amount of shift for each optical axis AX1, AX5 is:

$$2\Delta 1 = 21 \times \Delta p/10^6 \quad (3)$$

And, the amount of shift for each optical axis AX2, AX4 is:

$$\Delta I = 1 \times \Delta p/10^6 \quad (4)$$

When the angle of rotation of the plane parallel glass (fine angle) is $\theta$ (rad), the thickness thereof is t(mm), and the refractive index thereof is n, the amount $\Delta 1$(mm) of shift due to the rotation of the plane parallel glass is approximated as follows:

$$\Delta 1 \approx (1 - 1/n)t\theta \quad (5)$$

Therefore, $\theta$ becomes:

$$\theta = l \cdot \Delta p \cdot \frac{n}{(n-1)e} \cdot 10^{-4} \quad (6)$$

Then, by rotating the plane parallel glasses 4a to 4e at the respective angles of rotations $2\theta$, $\theta$, 0, $-\theta$, $-2\theta$ (the direction R in the drawing is made positive), the projection positions of the optical axes AX1 to AX5 are made to coincide with the positions $\alpha'$, $\beta'$, $\gamma'$, $\delta'$, $\epsilon'$. Thereby, the correction of the projected image in accordance with the extension of the photosensitive substrate in the Y-direction (the correction of the imaging positions) can be performed.

Figure 12:
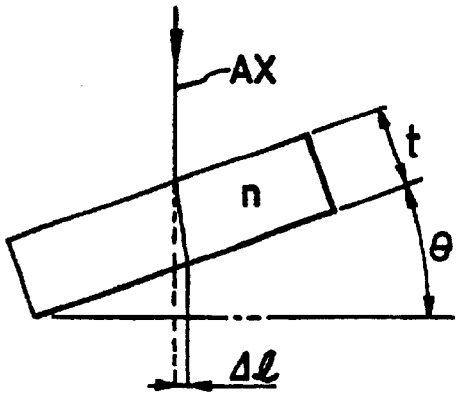
FIG. 12 is a diagram for explaining the rotation of the plane parallel glass and the shift of an image.

Also, for example, as shown in FIG. 12, if the plane parallel glass has the thickness t=3 (mm) and the refractive index n=1.74, and when the plane parallel glass is inclined at the angle $\theta$=1.0 (mrad), the optical axis AX is shifted by $\Delta 1$=1.3 ($\mu$m). And, if the magnification of projection optical system is 1:1, the imaging position on the photosensitive substrate is shifted by 1.3 ($\mu$m).

Then, as shown in FIG. 2, the control device 11 rotates the plane parallel glasses 4a to 4e by the drive device 12 based on the amount $\Delta 1$ of shift to change imaging positions.

When the expansion and contraction of the photosensitive substrate are not uniform with respect to its center in the Y-direction, i.e., when nonlinear expansion and contraction are produced in the photosensitive substrate, the deviation of each position on the photosensitive substrate is calculated and stored in the memory. For example, the positions of arbitrarily chosen patterns formed on the photosensitive substrate 5 are obtained by the use of another position detecting device and the deviations of the positions of those patterns from the respective design positions are obtained. Then, the expansion and contraction of each of those positions on the photosensitive substrate are obtained and stored in the memory of the control device 11. When performing exposure, the magnifications of the respective projection optical systems 3a to 3e are changed in accordance with the amounts of expansion and contraction and the plane parallel glasses 4a to 4e are rotated at respective angles of rotation in accordance with the changes of magnifications (the amounts of expansion and contraction). Also, when correcting the expansion and contraction of each arbitrarily chosen position on the photosensitive substrate in the X-direction, the magnifications of the projection optical systems and the angles of rotations of the plane parallel glasses are controlled continuously during scanning exposure. However, when the controls of the magnifications and the angles of rotations do not follow the scanning speed of the photosensitive, the amounts of expansion and contraction of the photosensitive substrate are averaged in the X-direction, and the magnifications and angles of rotations are controlled based on the averaged amount of expansion and contraction.

In the above embodiment, the thicknesses of the plane parallel glasses are approximately the same, but may be differentiated when the expansion and contraction of the photosensitive substrate are uniform with respect to its center. That is, as known from the expression (5), the amount of shift is proportional to the thickness of the glass. Therefore, if the thickness of the plane parallel glasses 4b, 4d is set to t and the thickness of the plane parallel glasses 4a, 4e is set to 2t, the angles of rotations of the plane parallel glasses 4a to 4e become the same. Therefore, the structure of the drive device 12 for driving the plane parallel glasses is simplified.

Figure 8:
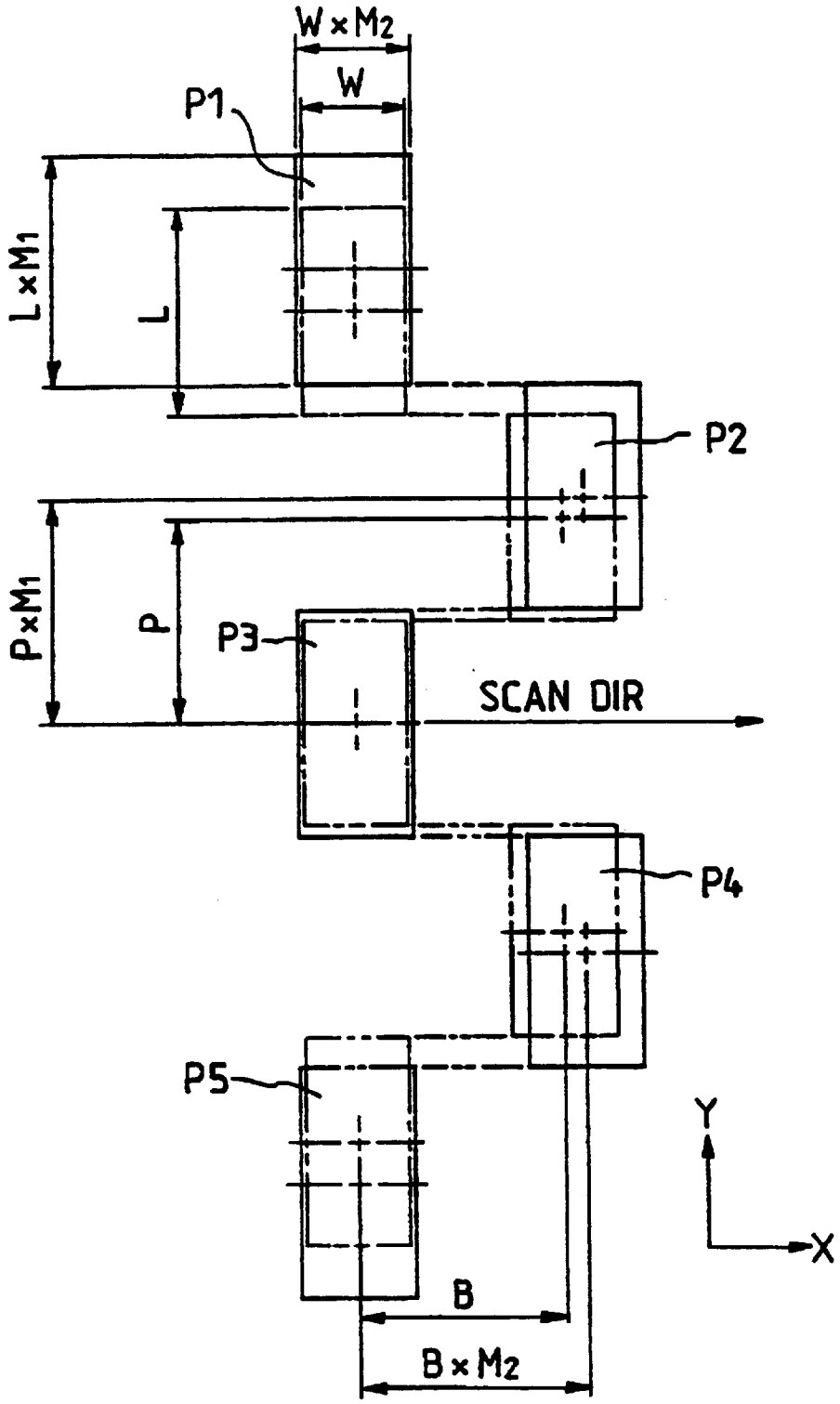
FIG. 8 is a diagram showing the change of magnification and the changes of positions of images.

In the above embodiment, although the change of magnification is uniform in both X- and Y-directions, there is a case that the expansion and contraction of the photosensitive substrate are different depending on the directions. In this case, as shown in FIG. 8, magnifications in the X- and Y-directions are changed by $M_1$ and $M_2$ times respectively. This can be performed by changing the magnifications of the projection optical systems 3a to 3e and correcting the relative 10 speed of the mask 2 and the photosensitive substrate 5 in during scanning exposure in the X-direction. Namely, for example, each magnification of the projection optical systems 3a to 3e is changed by $M_1$ times. And, regarding the difference between $M_1$ and $M_2$, the speed of at least one of the mask and the photosensitive substrate is decelerated or accelerated as the difference between the speeds of the mask and the photosensitive substrate.

FIG. 10 shows a modification of the scanning type exposure apparatus of the present invention. The same members and parts as those in the apparatus in FIG. 1 are designated by the same reference numerals. The points different from the apparatus in FIG. 1 are as follows. Namely, the apparatus in FIG. 10 has a carriage 17 capable of scanning and moving the mask 2 and the photosensitive substrate 5 together. Also, the mask 2 is disposed on a mask stage 13, and the mask stage 13 is driven by drive devices 14, 15, 16 such as motors in the X- and Y-directions and the direction of rotation (θ-direction) with respect to the optical axes of the illumination optical systems thereby to control the positions of the mask 2 in the X-, Y- and θ-directions. The positions of the mask stage 13 and the carriage 17 in the X-direction are detected respectively by measuring devices 18 and 19 such as laser interference measuring devices.

Figure 11:
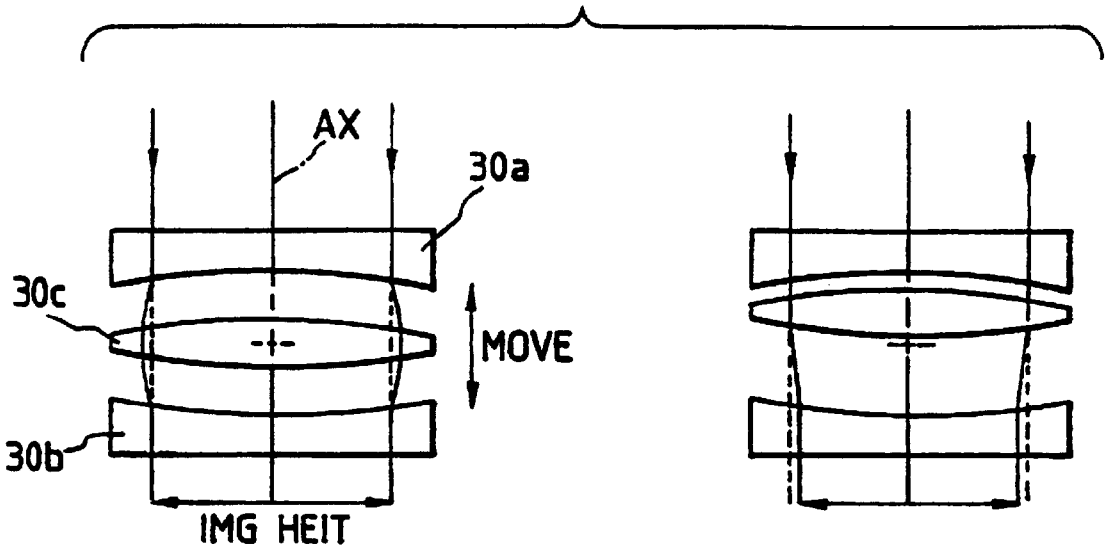
FIG. 11 shows another example of a magnification control device of the projection optical system.

The projection optical systems 3a to 3e are provided with respective magnification control devices 20 therein. As shown in FIG. 11, each magnification control device 20 is constituted by two plano-concave lens 30a and 30b having comparatively large radii of curvature and a biconvex lens 30. The image height is changed by shifting the biconvex lens 30c in the direction of the optical axis AX. For example, when lenses with the radius of curvature R=5000 (mm) and the refractive index n=1.74 are combined and the bioconvex lens is shifted by ±68 (μm), the magnification adjustment (image height adjustment) of ±20 ppm becomes possible.

The mask 2 is provided with alignment marks MA1 to MA3 and the photosensitive substrate 5 is provided with alignment marks PA1 to PA3. The positions of the alignment marks MA1 to MA3 and PA1 to PA3 are detected by alignment sensors A1 and A2 disposed above the mask 2. The alignment sensors A1 and A2 are provided to detect the alignment marks PA1 to PA3 via the mask 2 and two lateral end side projection optical systems 3a and 3e and can detect the relative positional relationship between the mask 2 and the photosensitive substrate 5. The positional deviations between the mask 2 and the photosensitive substrate 5 in the X- and Y-directions and the direction of rotation (θ-direction) are obtained based on the detected relative positional relationship and the alignment of the mask 2 and the photosensitive substrate 5 is performed by the drive devices 14 to 16.

The magnification error (expansion and contraction of the photosensitive substrate) of the photosensitive substrate 5 with respect to the mask 2 is detected by the alignment sensors A1 and A2. For example, the positions of two sets of alignment marks MA1 and PA1, MA2 and PA2 are detected. Then, from the ratio of the distance between the marks PA1 and PA2 to the distance between the marks MA1 and MA2, a magnification is obtained. That is, as shown in FIG. 10, the magnification ($M_1$) in the Y-direction is obtained by detecting two sets of alignment marks MA1 and PA1, MA2 and PA2 or more arranged along Y-direction, and the magnification ($M_2$) in the X-direction is obtained by detecting two sets of alignment marks MA2 and PA2, MA3 and PA3 or more.

Then, based on the obtained magnifications, the imaging position of the projection area defined by each projection optical system is corrected by $M_1$ times in the Y-direction and by $M_2$ times in the X-direction, and the plane parallel glasses 4a to 4e are rotated.

When performing exposure by scanning the carriage 17 after the imaging positions of the projection areas have been changed, the drive devices 14 to 16 are driven to move the mask stage 13, and the scanning exposure is performed such that the difference of the speeds of the mask and the photosensitive substrate with respect to the projection optical systems becomes $V\times(M_2-1)$. This case is the same as the above case in which the amount of expansion and contraction of the substrate in the X-direction is different from that of the substrate in the Y-direction.

The differences between the structures of the apparatuses in FIGS. 1 and 10 are replaceable mutually.

In the above embodiment, the plurality of illumination optical systems emit respective light fluxes to the plurality of projection optical systems, but a light flux from one illumination optical system may be divided into a plurality of light fluxes to be emitted to the respective projection optical systems.

Also, the respective alignment sensors detect diffracted light from the alignment marks, but may detect directly reflected light from alignment marks. In this case, the alignment marks may be continuous bar marks instead of the grating-like marks. In particular, the mark Dx may be a group of bar marks arranged in close proximity.

Also, in the apparatus in FIG. 1, instead of vibrating the above-mentioned beam By, the slit in the alignment sensor may be vibrated. Further, although the laser beams Bx and By shown in FIG. 4C are separated from each other, they may be integrated to be a cross-shaped beam if they can be separated by a light-receiving system.

Further, the measurement in the Y-direction is performed by detecting the phase of the waveform obtained from the vibrating beam in the above embodiment. However, there is another method in which the beam is not vibrated but fixed and the diffracted light or the directly reflected light from the mark is received by a sensor having two sensor divisions to obtain the signal intensity ratio of both sensor divisions electrically thereby to obtain the position information shown in FIG. 5B. If the electric signal intensities of the two sensor divisions are A and B, the ratio of (A−B)/(A+B) is obtained and the obtainment of position information does not depend on the signal intensity.

Furthermore, in the present embodiment, there is no specific limitation on the distance between the two marks Dy formed on the mask and the distance between the two marks Dy formed on the photosensitive substrate, but if both distances are made equal, the alignment marks of the mask are transferred to the photosensitive substrate in the exposure of the first layer and the transferred alignment marks can be used for the second and later layers on the photosensitive substrate. In this case, when the exposure for the third or more layers are required, it is preferable to provide a shutter in a position conjugate to the field stop in order to prevent the transfer of the alignment marks of the mask in the second and later exposures.

What is claimed is:

1. A scanning type exposure apparatus for exposing a pattern region on a mask to a substrate by scanning said mask and said substrate with respect to a plurality of projection optical systems in a predetermined direction with a speed ratio in accordance with a magnification of said projection optical system, comprising:

a plurality of illumination optical systems for illuminating respective areas of said pattern region on said mask with respective light fluxes;

said plurality of projection optical systems being arranged so as to correspond to said respective illumination optical systems, said projection optical systems projecting respective images of said areas illuminated by said respective illumination optical system onto respective projection areas on said substrate;

a magnification changing device for detecting a change of shape of said substrate and changing a magnification of at lest one of said projection optical systems in accordance with the change of shape of said substrate; and an imaging position changing device for changing the position of an image projected via said at least one projection optical system in accordance with said change in magnification.

2. A scanning type exposure apparatus according to claim 1, further comprising a control device for changing, in accordance with, among said change of shape, a change in a direction perpendicular to said predetermined direction, the magnification of said at least one projection optical system, and the position of said image projected via said at least one projection optical system in said perpendicular direction, and changing the position of said image of said at least one projection optical system in said scanning direction in accordance with, among said change of shape, a change in said scanning direction.

3. A scanning type exposure apparatus according to claim 1, further comprising a speed ratio changing means device for changing said speed ratio in accordance with the change of shape of said substrate.

4. A scanning type exposure apparatus according to claim 1, wherein said plurality of projection optical systems are arranged such that adjacent projection optical systems in a direction perpendicular to said predetermined direction are displaced from each other in said predetermined direction to form a plurality of rows in said perpendicular direction.

5. A scanning type exposure apparatus according to claim 1, wherein said imaging position changing device comprises a plurality of plane parallel glasses with the same thickness disposed in respective optical axes of said projection optical systems and said plane parallel glasses are displaced at respectively different angles with respect to said respective optical axes in accordance with the change of shape of said substrate.

6. A scanning type exposure apparatus according to claim 1, wherein said imaging position changing device comprises a plurality of plane parallel glasses with different thicknesses disposed in respective optical axes of said projection optical systems and said plane parallel glasses are displaced at the same angle with respect to said respective optical axes in accordance with the change of shape of said substrate.

7. A scanning type exposure apparatus according to claim 1, wherein said substrate has a plurality of alignment marks arranged in the vicinity of said projection areas along said predetermined direction, said apparatus further comprising a mark detecting device disposed with a predetermined positional relationship with respect to said projection optical systems in a position capable of detecting at least a portion of said alignment marks so as to detect said alignment marks while said mask and said substrate are moved; and a positioning device for correcting the position of said mask or said substrate with respect to said projection optical systems in accordance with the detection result of said mark detecting device.

8. A scanning type exposure apparatus according to claim 7, wherein the change of shape of said substrate is obtained in accordance with positions of said alignment marks detected by said mark detecting device.

9. A scanning type exposure apparatus according to claim 1, wherein said projection optical systems are a magnification-erection type.

10. A scanning type exposure apparatus according to claim 1, further comprising a holding member for holding said mask and said photosensitive substrate together.

11. A method of exposing a pattern image of a mask to a substrate via a plurality of projection optical systems, comprising the steps of:

detecting a change of shape of said substrate;

changing a magnification of at least one of said projection optical systems in accordance with the change of shape of said substrate; and changing the position of an image projected via said at least one projection optical system in accordance with the change of magnification of said at least one projection optical system.

12. A method according to claim 11, further comprising the steps of changing, in accordance with, among said change of shape, a change in a direction perpendicular to said predetermined direction, the magnification of said at least one projection optical system, and the position of said image projected via said at least one projection optical system in said perpendicular direction; and changing the position of said image projected via said at least one projection optical system in said predetermined direction in accordance with, among said change of shape, a change in said predetermined direction.

13. A method according to claim 11, further comprising the step of changing said speed ratio in accordance with the change of shape of said substrate.

14. A scanning type exposure apparatus comprising:

a plurality of projection optical systems for respectively projecting a pattern image of a mask onto a substrate;

a moving device for moving said mask and said substrate relative to said projection optical systems, while holding said mask and said substrate together; and an adjusting device for detecting a change of shape of said substrate, and for adjusting at least one imaging characteristic of said projection optical systems.

*15. An exposure apparatus for exposing a pattern of a mask onto a substrate, comprising:*

*an image transfer system that projects the pattern of the mask onto the substrate while moving the mask and the substrate synchronously during the projection of the pattern onto the substrate such that portions of the pattern overlap each other;*

*an imaging characteristic adjusting mechanism disposed in a space between the mask and the substrate, to adjust imaging characteristics of a portion of the image transfer system that projects the pattern onto the substrate; and*

*an exposure system that exposes the pattern during the synchronous movement of the mask and the substrate by the image transfer system.*

*16. The exposure apparatus according to claim 15, wherein the imaging characteristic adjusting mechanism includes an optical member.*

*17. The exposure apparatus according to claim 15, wherein the exposure apparatus includes a plurality of projection optical systems.*

*18. The exposure apparatus according to claim 17, wherein the exposure apparatus includes five of the projection optical systems.*

*19. The exposure apparatus according to claim 15, wherein a magnification of the portion of the image transfer system that projects the pattern onto the substrate is substantially equal to one.*

*20. The exposure apparatus according to claim 15, wherein a projection area of the portion of the image transfer system that projects the pattern onto the substrate has a trapezoidal shape.*

*21. The exposure apparatus according to claim 15, wherein a projection area of the portion of the image transfer system that projects the pattern onto the substrate has a polygonal shape.*

*22. The exposure apparatus according to claim 15, wherein the imaging characteristic adjusting mechanism includes a light transmissive optical member.*

*23. The exposure apparatus according to claim 15, wherein the imaging characteristic adjusting mechanism adjusts a magnification of the portion of the image transfer system that projects the pattern onto the substrate.*

*24. The exposure apparatus according to claim 15, wherein the imaging characteristic adjusting mechanism adjusts a size of the pattern formed on the substrate by the portion of the image transfer system that projects the pattern onto the substrate.*

*25. The exposure apparatus according to claim 15, wherein the imaging characteristic adjusting mechanism adjusts a location where the pattern is formed on the substrate by the portion of the image transfer system that projects the pattern onto the substrate.*

*26. A scanning exposure apparatus comprising:*

*an image transfer system that projects a pattern on a mask onto a substrate while moving the mask and the substrate synchronously during the projection of the pattern onto the substrate; and*

*an imaging characteristic adjusting mechanism that adjusts imaging characteristics of a portion of the image transfer system that projects the pattern of the mask onto the substrate, the imaging characteristic adjusting mechanism disposed in a space that includes the substrate and the portion of the image transfer system that projects the pattern onto the substrate;*

*the image transfer system performing a transfer of the pattern on the mask onto the substrate by overlapping transfer of the pattern onto the substrate.*

*27. The scanning exposure apparatus according to claim 26, wherein the imaging characteristic adjusting mechanism includes an optical member.*

*28. The scanning exposure apparatus according to claim 26, wherein the image transfer system includes a plurality of projection optical systems.*

*29. The scanning exposure apparatus according to claim 28, wherein the image transfer system includes five of the projection optical systems.*

*30. The scanning exposure apparatus according to claim 26, wherein a magnification of the portion of the image transfer system that projects the pattern onto the substrate is substantially equal to one.*

*31. The scanning exposure apparatus according to claim 26, wherein a projection area of the portion of the image transfer system that projects the pattern onto the substrate has a trapezoidal shape.*

*32. The scanning exposure apparatus according to claim 26, wherein a projection area of the portion of the image transfer system that projects the pattern onto the substrate has a polygonal shape.*

*33. The scanning exposure apparatus according to claim 26, wherein the imaging characteristic adjusting mechanism includes a light transmissive optical member.*

*34. The scanning exposure apparatus according to claim 26, wherein the imaging characteristic adjusting mechanism adjusts a magnification of the portion of the image transfer system that projects the pattern onto the substrate.*

*35. The scanning exposure apparatus according to claim 26, wherein the imaging characteristic adjusting mechanism adjusts a size of the pattern formed on the substrate by the portion of the image transfer system that projects the pattern onto the substrate.*

*36. The scanning exposure apparatus according to claim 26, wherein the imaging characteristic adjusting mechanism adjusts a location where the pattern is formed on the substrate by the portion of the image transfer system that projects the pattern onto the substrate.*

*37. A method of performing exposure with an exposure apparatus, comprising the steps of:*

*utilizing an image transfer system to project an image of a pattern on a mask onto a substrate to form the pattern onto the substrate while moving the mask and the substrate synchronously such that portions of the pattern overlap each other on the substrate; and*

*adjusting at least one imaging characteristic of a portion of the image transfer system located between the mask and the substrate, the adjusting being accomplished by using an imaging characteristic adjusting mechanism disposed in a space between the substrate and the portion of the image transfer system that projects the pattern onto the substrate.*

*38. The method according to claim 37, wherein the imaging characteristic adjusting mechanism includes an optical member.*

*39. The method according to claim 37, wherein the image transfer system includes a plurality of projection optical systems, and the adjusting step is performed with respect to at least one of the plurality of projection optical systems.*

*40. The method according to claim 39, wherein there are five of the projection optical systems.*

*41. The method according to claim 37, wherein a magnification of the portion of the image transfer system that projects the pattern onto the substrate is substantially equal to one.*

*42. The method according to claim 37, wherein a projection area of the portion of the image transfer system that projects the pattern onto the substrate has a trapezoidal shape.*

*43. The method according to claim 37, wherein a projection area of the portion of the image transfer system that projects the pattern onto the substrate has a polygonal shape.*

*44. The method according to claim 37, wherein the imaging characteristic adjusting mechanism includes a light transmissive optical member.*

*45. The method according to claim 39, wherein the adjusting step adjusts a magnification of the portion of the image transfer system that projects the pattern onto the substrate.*

*46. The method according to claim 37, wherein the adjusting step adjusts a size of the pattern formed on the substrate by the portion of the image transfer system that projects the pattern onto the substrate.*

*47. The method according to claim 37, wherein the adjusting step adjusts a location where the pattern is formed on the substrate by the portion of the image transfer system that projects the pattern onto the substrate.*

*48. A substrate on which an image has been exposed utilizing the method of claim 37.*

*49. A method of performing exposure with a scanning exposure apparatus, comprising the steps of:*

*utilizing an image transfer system to project an image of a pattern on a mask onto a substrate to form the pattern onto the substrate while moving the mask and the substrate synchronously; and*

*adjusting at least one imaging characteristic of a portion of the image transfer system that projects the pattern onto the substrate, the adjusting being accomplished by using an imaging characteristic adjusting mechanism disposed in a space that includes the substrate and the portion of the image transfer system that projects the pattern onto the substrate;*

*wherein the imaging transfer system transfers the pattern on the mask onto the substrate by overlapping transfer of the pattern onto the substrate.*

*50. The method according to claim 49, wherein the imaging characteristic adjusting mechanism includes an optical member.*

*51. The method according to claim 49, wherein the image transfer system includes a plurality of projection optical systems, the adjusting step being performed on at least one of the plurality of projection optical systems.*

*52. The method according to claim 51, wherein there are five of the projection optical systems.*

*53. The method according to claim 49, wherein a magnification of the portion of the image transfer system that projects the pattern onto the substrate is substantially equal to one.*

*54. The method according to claim 49, wherein a projection area of the portion of the image transfer system that projects the pattern onto the substrate has a trapezoidal shape.*

*55. The method according to claim 49, wherein a projection area of the portion of the image transfer system that projects the pattern onto the substrate has a polygonal shape.*

*56. The method according to claim 49, wherein the imaging characteristic adjusting mechanism includes a light transmissive optical member.*

*57. The method according to claim 73, wherein the adjusting step adjusts a magnification of the portion of the image transfer system that projects the pattern onto the substrate.*

*58. The method according to claim 49, wherein the adjusting step adjusts a size of the pattern formed on the substrate by the portion of the image transfer system that projects the pattern onto the substrate.*

*59. The method according to claim 49, wherein the adjusting step adjusts a location where the pattern is formed on the substrate by the portion of the image transfer system that projects the pattern onto the substrate.*

*60. A substrate on which an image has been exposed utilizing the method of claim 49.*

*61. An exposure apparatus for exposing a pattern of a mask onto a substrate, comprising:*

*image transferring means for transferring the pattern of the mask onto the substrate while moving the mask and the substrate synchronously during projection of the pattern onto the substrate such that portions of the pattern overlap each other;*

*imaging characteristic adjusting means disposed in a space between the mask and the substrate, to adjust imaging characteristics of a portion of the image transferring means that projects the pattern onto the substrate; and*

*exposing means for exposing the pattern during the synchronous movement of the mask and the substrate by the image transferring means.*

* * * * *

UNITED STATES PATENT AND TRADEMARK OFFICE

CERTIFICATE OF CORRECTION

PATENT NO. : RE 37,361 E
DATED : September 11, 2001
INVENTOR(S) : Masamitsu Yanagihara et al.

It is certified that error appears in the above-identified patent and that said Letters Patent is hereby corrected as shown below:

Title page,
Item [75], Inventors, change "Tsuyohsi" to -- Tsuyoshi --.

Signed and Sealed this

Sixteenth Day of December, 2003

JAMES E. ROGAN
*Director of the United States Patent and Trademark Office*